(12) United States Patent
Ko et al.

(10) Patent No.: US 12,592,337 B2
(45) Date of Patent: Mar. 31, 2026

(54) CAPACITOR AND ELECTRONIC DEVICE COMPRISING SAME

(71) Applicant: SAMSUNG ELECTRONICS CO., LTD., Suwon-si (KR)

(72) Inventors: Jaehyun Ko, Suwon-si (KR); Sungyong Joo, Suwon-si (KR); Jeongil Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 469 days.

(21) Appl. No.: 18/116,110

(22) Filed: Mar. 1, 2023

(65) Prior Publication Data

US 2023/0207190 A1     Jun. 29, 2023

Related U.S. Application Data

(63) Continuation of application No. PCT/KR2021/016660, filed on Nov. 15, 2021.

(30) Foreign Application Priority Data

Nov. 17, 2020     (KR) ........................ 10-2020-0153885

(51) Int. Cl.
*H01G 2/00* (2006.01)
*H01G 2/06* (2006.01)
(Continued)

(52) U.S. Cl.
CPC .............. *H01G 2/06* (2013.01); *H01G 9/008* (2013.01); *H05K 1/184* (2013.01); *H05K 2201/10015* (2013.01)

(58) Field of Classification Search
CPC .......... H01G 2/06; H01G 9/008; H05K 1/184; H05K 2201/10015
See application file for complete search history.

(56) References Cited

U.S. PATENT DOCUMENTS 9,596,763 B2     3/2017  Nakamura
2004/0066589 A1*    4/2004  Togashi ................ H01G 2/065
                                            361/15
(Continued)

FOREIGN PATENT DOCUMENTS

EP          2919565        9/2015
JP          2014-96537 A   5/2014

OTHER PUBLICATIONS

KR200460596 (Year: 2012).*
(Continued)

*Primary Examiner* — Pete T Lee
(74) *Attorney, Agent, or Firm* — Nixon & Vanderhye P.C.

(57) ABSTRACT

A capacitor and an electronic device comprising same are disclosed. An electronic device according to the present disclosure may comprise: a substrate; a plurality of capacitors mounted on the substrate, each of the plurality of capacitors including a case extending to accommodate an electrolyte therein, and a cap coupled to one end of the case in the direction in which the case extends configured to restrict scattering of the electrolyte; and a fixing member comprising a protrusion and configured to press the perimeters of the caps in the radial direction of the caps to fix the plurality of capacitors to the substrate.

15 Claims, 17 Drawing Sheets

1

(51) Int. Cl.
  H01G 9/008       (2006.01)
  H05K 1/184       (2026.01)

(56)       References Cited

U.S. PATENT DOCUMENTS

2011/0019376 A1 *   1/2011   Hardin ................... H05K 1/184
                                                                  361/763
2016/0104574 A1 *   4/2016   Whitmire ............. H05K 3/3447
                                                                  174/126.1

OTHER PUBLICATIONS

Extended European Search Report dated Feb. 1, 2024 issued in European Patent Application No. 21895044.2.
Korean Office Action issued Apr. 11, 2025 in corresponding Korean Patent Application No. 10-2020-0153885.

* cited by examiner

CAPACITOR AND ELECTRONIC DEVICE COMPRISING SAME

CROSS-REFERENCE TO RELATED APPLICATIONS

This application is a continuation of International Application No. PCT/KR2021/016660 designating the United States, filed on Nov. 15, 2021, in the Korean Intellectual Property Receiving Office and claiming priority to Korean Patent Application No. 10-2020-0153885, filed on Nov. 17, 2020, in the Korean Intellectual Property Office, the disclosures of which are incorporated by reference herein in their entireties.

BACKGROUND

Field

The disclosure relates to a capacitor having an improved structure and an electronic device including the same. The disclosure relates to a container having an improved structure and an electronic device including the same.

Description of Related Art

Capacitors are widely used in various electronic devices, and may be used, for example, in components of a television (TV) or power boards.

When a capacitor is mounted on a substrate, relatively bulky subsidiary materials may be used to assist in mounting the capacitor. Subsidiary materials may occupy a large area on the substrate and thus the area utilization of the substrate may be lowered. In addition, when the capacitor is fixed, a large number of subsidiary materials are required and it is not easy to install the subsidiary materials, which may reduce productivity.

Accordingly, there is a need to increase the area utilization and productivity of a substrate when mounting a capacitor on the substrate.

SUMMARY

Embodiments of the disclosure provide a capacitor and an electronic device including the same in which the production cost is reduced and the production efficiency is improved.

Embodiments of the disclosure provide an electronic device in which the area utilization of a substrate is increased when mounting a capacitor.

According to an example embodiment of the disclosure, there is provided an electronic device including: a substrate including a hole; a plurality of capacitors each including a body extending to be inserted into the hole and an electrode wire provided at one end of the body and electrically connected to the substrate; and a fixing member including a protrusion configured to press an other end of the body toward the substrate to fix the plurality of capacitors to the substrate.

The fixing member may include an insertion protrusion protruding in a direction perpendicular to the substrate to be coupled to the substrate, and the substrate may include a coupling portion corresponding to the insertion protrusion.

The electronic device may include caps coupled to the other ends of the bodies to prevent/reduce an electrolyte provided inside the bodies from being scattered, the caps may each include a substrate coupling groove formed at one end thereof as a recession, and the substrate includes a plurality of coupling protrusions protruding toward the hole to be respectively coupled to the substrate coupling grooves.

The bodies and the caps may have a cylindrical shape, the hole may include a first portion into which each of the bodies may be inserted and a second portion into which each of the caps may be inserted, the caps may each include a first region having a same diameter as a diameter of the body and a second region having a diameter smaller than the diameter of the first region to have a level difference from the first region, and a width of the second portion is provided to be shorter than a diameter of each of the second regions.

The substrate may include a cap supporting portion disposed between the first regions, and a length of the cap supporting portion is provided to be longer than a length obtained by subtracting a diameter length of the second region from a diameter length of the first region.

Each of the plurality of coupling protrusions may include a rounding portion configured to guide coupling with a respective one of the substrate coupling grooves.

The fixing member may include a plurality of anti-rotation protrusions protruding toward the caps configured to restrict the bodies from rotating, and the caps may each include an anti-rotation groove corresponding to a respective one of the plurality of anti-rotation protrusions accommodating the respective one of the plurality of anti-rotation protrusions.

At least a part of the fixing member in contact with the caps may include a flat surface configured to restrict the body from rotating, and at least a part of each of the caps in contact with the fixing member may include a flat surface.

The caps may each include a plurality of regions stepped from each other in a direction in which the bodies may extend, the plurality of regions may include a first region coupled to the body, a second region forming a level difference from the first region configured to guide mounting of the body, and a third region forming a level difference from the second region and in which the substrate coupling groove may formed, and the third region may include an upper surface including a flat surface, and left and right side surfaces including flat surfaces configured to restrict the cap from shaking in a left-right direction.

The substrate may include a support rib provided between the plurality of capacitors in a direction in which the bodies may extend, to support the plurality of capacitors in a up-down direction.

The fixing member may include an auxiliary substrate on which a circuit pattern may be formed, and the auxiliary substrate may be electrically connected to a circuit pattern formed on the substrate.

According to an example embodiment of the disclosure, there is provided an electronic device including: a substrate including a hole and a coupling protrusion protruding toward the hole; and a capacitor including a body extending to be inserted into the hole and a cap coupled to one end of the capacitor along a direction in which the body extends, wherein the cap includes a substrate coupling groove recessed at one end of the cap corresponding to the coupling protrusion for the substrate coupling groove being coupled to the coupling protrusion.

The cap may include a plurality of regions stepped from each other in a direction in which the body may extend, the plurality of regions may include a first region coupled to the body, a second region forming a level difference from the first region configured to guide mounting of the body, and a third region forming a level difference from the second region and in which the substrate coupling groove may formed, and the third region may include an upper surface including a flat surface, and left and right side surfaces including flat surfaces configured to restrict the cap from shaking in a left-right direction.

The electronic device may include a fixing member comprising a protrusion configured to press the body to fix the body to the substrate.

The fixing member may include an insertion protrusion protruding toward the substrate to be coupled to the substrate, and the substrate may include a coupling portion formed corresponding to the insertion protrusion.

The hole may include a first portion into which the body may be inserted and a second portion into which the cap may be inserted, and the coupling protrusion may protrude into the second portion.

According to an example embodiment of the disclosure, there is provided an electronic device including: a substrate; a capacitor including a body extending in a first direction and accommodating an electrolyte therein; and a fixing member including an insertion protrusion protruding in a second direction to be coupled to the substrate, the fixing member configured to press the body in the second direction to fix the body to the substrate, wherein the substrate includes a coupling portion formed corresponding to the insertion protrusion to be coupled to the insertion protrusion.

The substrate may include: a hole into which the capacitor may be inserted; and a coupling protrusion protruding in the first direction toward the hole, and the body may include a substrate coupling groove corresponding to the coupling protrusion to be coupled to the coupling protrusion.

The fixing member may include an anti-rotation protrusion protruding in the second direction configured to restrict the body from rotating, and the body may include an anti-rotation groove corresponding to the anti-rotation protrusion to accommodate the anti-rotation protrusion.

At least a part of the fixing member in contact with the body may include a flat surface configured to restrict the body from rotating, and at least a part of the body in contact with the fixing member may include a flat surface.

According to an example embodiment of the disclosure, a capacitor and an electronic device including the same in which the production cost is reduced and the production efficiency is improved by reducing the number of subsidiary materials can be provided.

According to an example embodiment of the disclosure, an electronic device in which the area utilization of a substrate is increased by reducing the distance between capacitors can be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
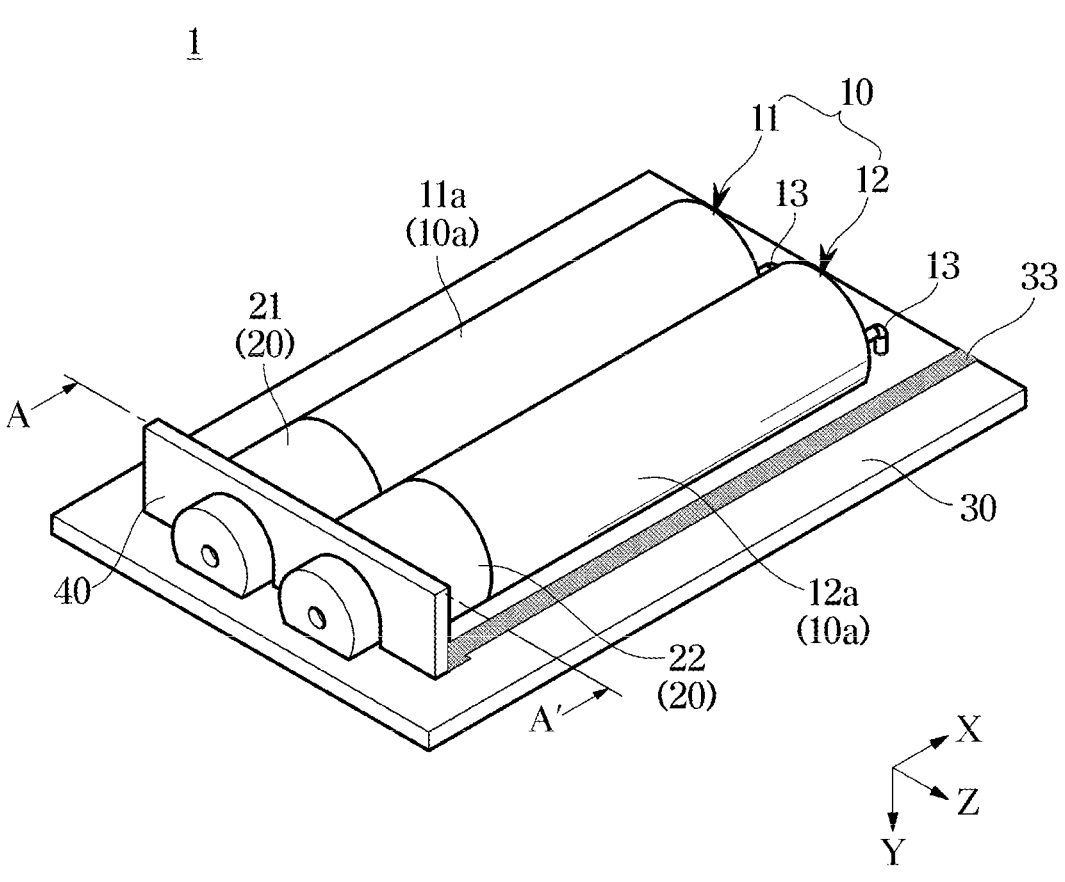
FIG. 1 is a perspective view illustrating a capacitor and an electronic device including the same according to various embodiments.

The various example embodiments set forth herein and illustrated in the configuration according to the disclosure are merely example embodiments, so it should be understood that they may be replaced with various equivalents and modifications at the time according to the disclosure.

Throughout the drawings, like reference numerals refer to like parts or components.

The terminology used herein is for the purpose of describing various embodiments only and is not intended to restrict and/or limit the disclosure. It is to be understood that the singular forms "a," "an," and "the" include plural references unless the context clearly dictates otherwise. It will be further understood that the terms "include", "comprise" and/or "have" when used in this disclosure, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to refer to various components, but the components are not limited by the terms. The ordinal terms are for the purpose of distinguishing a component from another. Thus, a first element, component, region, layer or section discussed below could be termed a second element, component, region, layer or section without departing from the teachings according to the disclosure. Descriptions shall be understood as to include any and all combinations of one or more of the associated listed items when the items are described using the conjunctive term "~and/or~," or the like.

Meanwhile, in this disclosure, the terms "front", "rear", "left", and "right" are defined based on the drawings, and the terms may not restrict the shape and position of the respective components.

Hereinafter, various example embodiments according to the disclosure will be described in greater detail with reference to the accompanying drawings.

Figure 2:
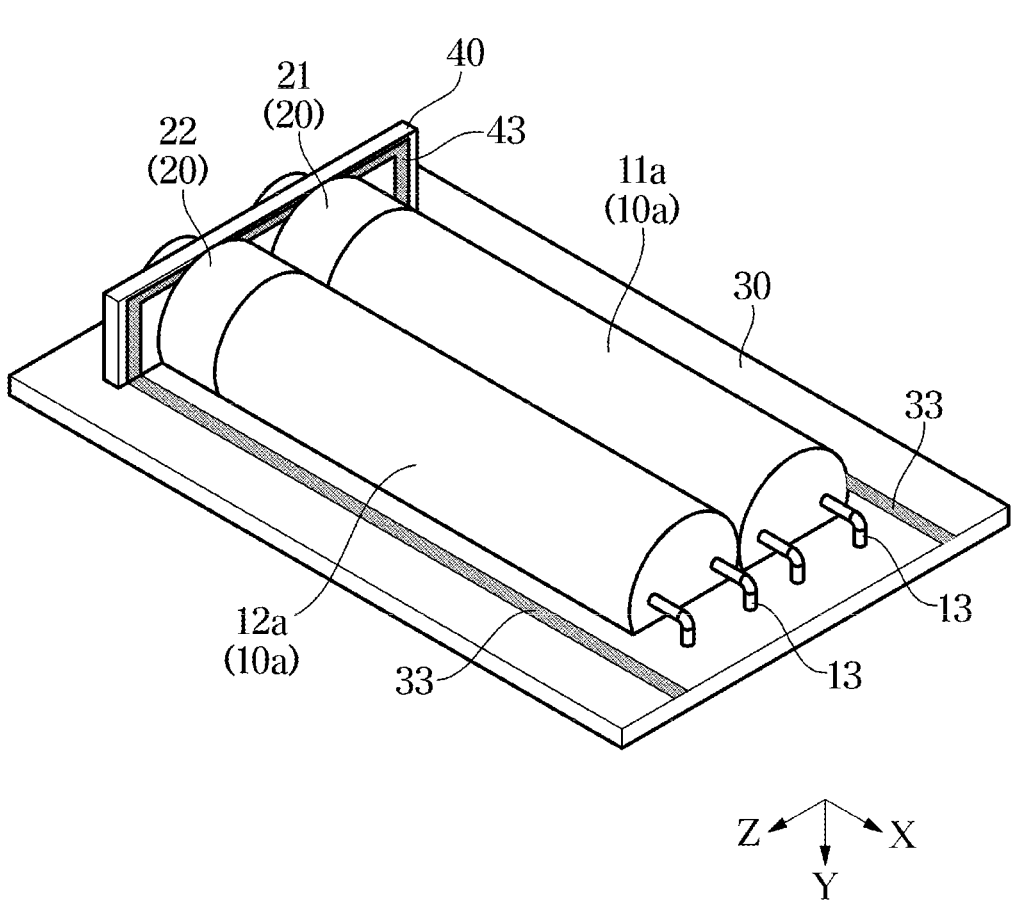
FIG. 2 is a perspective view illustrating the capacitor and the electronic device including the same shown in FIG. 1, which is viewed at a different angle according to various embodiments.

FIG. 1 is a perspective view illustrating a capacitor and an electronic device including the same according to various embodiments. FIG. 2 is a perspective view illustrating the capacitor and the electronic device including the same shown in FIG. 1, which is viewed at a different angle according to various embodiments.

Referring to FIGS. 1 and 2, an electronic device 1 may include a capacitor 10, a cap 20, an electrode wire 13, a substrate 30, and a fixing member (e.g., including a protrusion) 40. The capacitor 10 may be an aluminum capacitor 10. However, the type of the capacitor 10 is not limited and may include various capacitors 10.

The capacitor 10 may include a case 10a. The case 10a may have a cylindrical shape. However, it is not limited thereto and may include various shapes. An electrolyte may be accommodated inside the case 10a. The case 10a may extend along a first direction X to accommodate the electrolyte. The case 10a accommodating the electrolyte of the capacitor 10 may be the body 10a of the capacitor 10. The case 10a accommodating the electrolyte of the capacitor 10 may be referred to as the body 10a of the capacitor 10.

The electrode wire 13 may be connected to the case 10a. The electrode wire 13 may be connected to an anode or a cathode to allow current to flow therethrough. The electrode wire 13 may be soldered to the substrate 30 such that the substrate 30 and the capacitor 10 are electrically connected to each other.

The capacitor 10 may be provided in plural. The capacitor 10 may include a first capacitor 11 and a second capacitor 12. The number of capacitors 10 is not limited to two, and one or three or more capacitors 10 may be mounted on the substrate 30.

The cap 20 provided to prevent and/or reduce ignition may be coupled to one end of each of the capacitors 10. Each of the caps 21 and 22 may be provided to surround (e.g., cover) one end of a corresponding one of the cases 11a and 12a. The caps 21 and 22 may include internal spaces (not shown) in which the electrolyte leaked from the capacitor 10 may gather.

The caps 21 and 22 may include a first cap 21 and a second cap 22. The caps 21 and 22 may be formed to correspond to the capacitors 10. For example, the first cap 21 may be a cap for preventing and/or reducing ignition of the first capacitor 11. The second cap 22 may be a cap for preventing and/or reducing ignition of the second capacitor 12. According to the aspect of the present disclosure, since the number of capacitors 10 is not limited, the number of caps 21 and 22 is also not limited.

A circuit pattern 33 may be formed on the substrate 30. In the drawing, the circuit pattern 33 is illustrated on the upper surface of the substrate 30, but is not limited thereto, and may also be illustrated on the lower surface of the substrate 30 and may be formed in various positions. In addition, the circuit pattern 33 may be formed on both the upper and lower surfaces of the substrate 30. The substrate 30 may include a wire hole 32 into which the wire 13 may be inserted.

The fixing member 40 may press the caps 21 and 22 in a second direction Y. For example, the fixing member 40 may press the circumferences of the caps 21 and 22 such that the capacitors 10 including the caps 21 and 22 are fixed to the substrate 30. In addition, the fixing member 40 may also fix the capacitors 10 by pressing the circumferences of the cases 10a instead of the caps 21 and 22.

With the fixing member 40 according to the embodiment of the present disclosure, the plurality of capacitors 10 may be fixed to the substrate 30 while minimizing and/or reducing subsidiary materials. Accordingly, production cost and production efficiency may be improved.

In addition, the substrate 30 may include a hole 31 (refer, e.g., to FIG. 3) through which the capacitor 10 may be inserted. A part of the substrate 30 removed to form the hole 31 may be used when manufacturing the fixing member 40. Accordingly, the production cost may be reduced.

In addition, since an unnecessary space between the capacitors 10 when mounting the capacitors 10 on the substrate 30 may be minimized and/or reduced, space utilization of the substrate 30 may be increased.

The fixing member 40 may include an auxiliary substrate 40. For example, the fixing member 40 may be provided by recycling a part of the substrate 30 removed to form the hole 31. In addition, a circuit pattern 43 may be formed on the fixing member 40. Accordingly, the circuit pattern 33 formed on the substrate 30 may be electrically connected to the circuit pattern 43 formed on the fixing member 40 by, for example, soldering.

Through this, productivity may be increased without the need to use a separate fixing member 40, and production cost and production efficiency may be increased because the circuit patterns are directly connected without the need to detour outside of the caps 21 and 22.

In the drawings, the circuit pattern 43 of the fixing member 40 is illustrated as being formed on the rear surface of the fixing member 40, but is not limited thereto, and may be formed on the front surface or on both front and rear surfaces of the fixing member 40.

Figure 3:
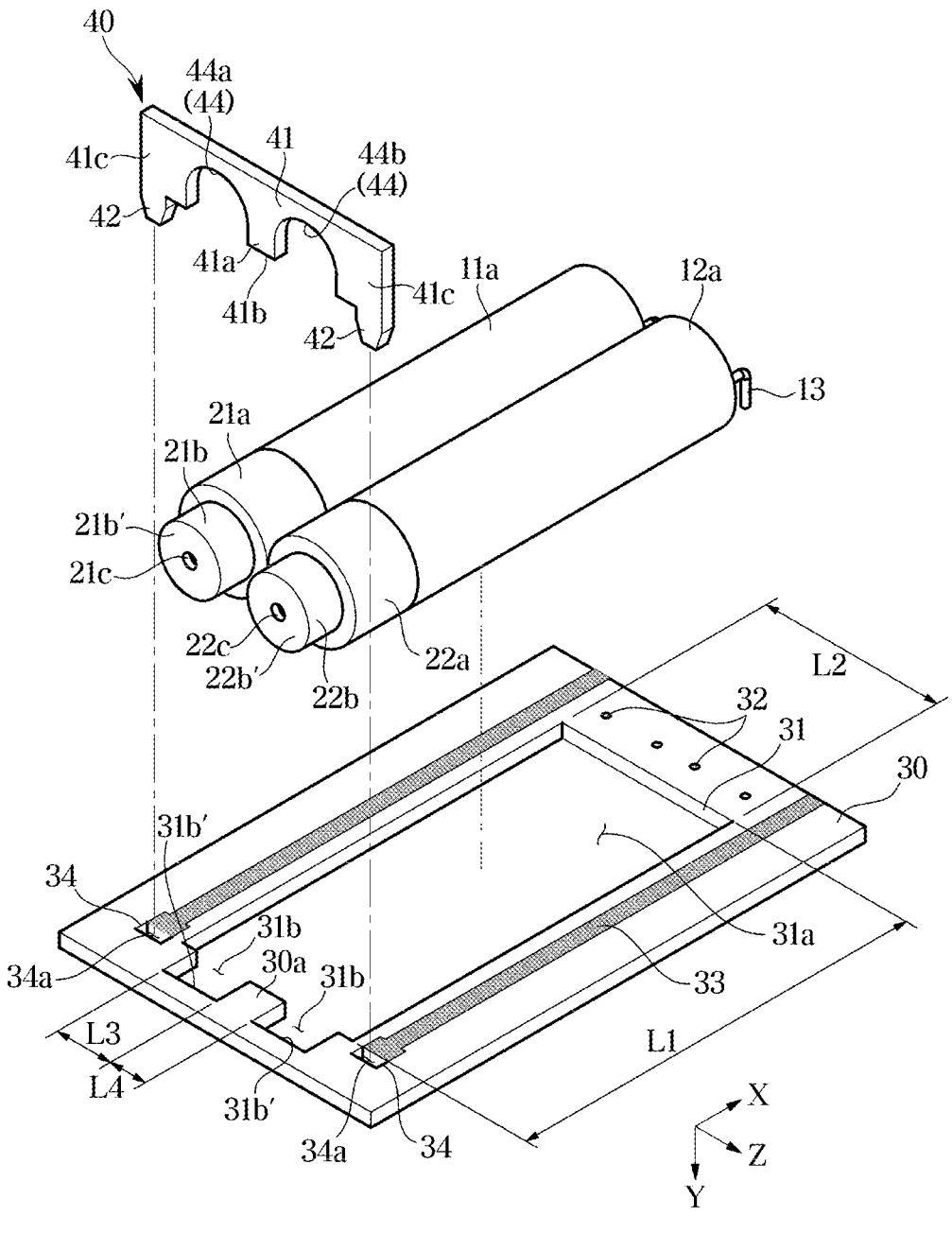
FIG. 3 is an exploded perspective view illustrating the capacitor and the electronic device including the same shown in FIG. 1 according to various embodiments.
Figure 4:
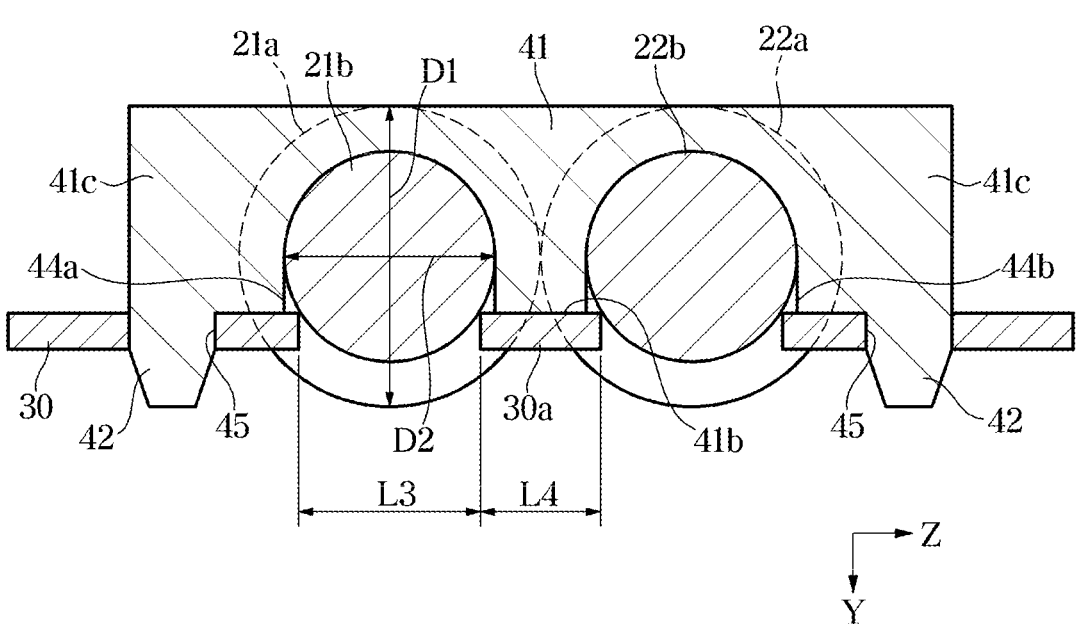
FIG. 4 is a cross-sectional view of the capacitor and the electronic device including the same shown in FIG. 1, which is taken along line A-A' according to various embodiments.

FIG. 3 is an exploded perspective view illustrating the capacitor and the electronic device including the capacitor shown in FIG. 1 according to various embodiments. FIG. 4 is a cross-sectional view of the capacitor and the electronic device including the capacitor shown in FIG. 1, taken along line A-A' according to various embodiments.

Referring to FIGS. 3 and 4, the caps 21 and 22 may include first regions 21a and 22a having the same diameter D1 as that of the cases 11a and 12a, second regions 21b and 22b having a diameter D2 smaller than that of the diameter D1 of the first regions 21a and 22a, and ejection holes 21c and 22c provided to eject electrolyte gas leaked from explosion-proof surfaces of the capacitors 10.

The first regions 21a and 22a may have level differences from the second regions 21b and 22b. The first regions 21a and 22a of the caps 21 and 22 may be inserted into a first portion 31a of the hole 31. For example, the cases 11a and 12a and the first regions 21a and 22a of the caps 21 and 22 may be inserted into the first portion 31a of the hole 31. The second regions 21b and 22b of the caps 21 and 22 may be inserted into a second portion 31b of the hole 31. Since the caps 21 and 22 are provided in plural, the first regions 21a and 22a as well as the second regions 21b and 22b may also be provided in plural. For example, the first cap 21 may include the first region 21a, the second region 21b, and the ejection hole 21c, and the second cap 22 may also include the first region 22a, the second region 22b, and the ejection hole 22c. In addition, each of the caps 21 and 22 may include all components described below.

The ejection hole 22c may be provided in the second region 22b to eject the electrolyte gas leaked from the explosion-proof surface of the capacitor 10.

The second regions 21b and 22b may include substrate contact surfaces 21b' and 22b' in contact with the substrate 30. The substrate contact surfaces 21b' and 22b' may be formed at one end of the second regions 21b and 22b, respectively, along the first direction X. The substrate contact surfaces 21b' and 22b' may be in contact with a cap contact surface 31b' of the substrate 30. The substrate contact surfaces 21b' and 22b' may be front surfaces 21b' and 22b' of the second regions.

The ejection holes 21c and 22c may be formed in the second regions 21b and 22b. Although the ejection holes 21c and 22c are illustrated as being formed in the centers of the second regions 21b and 22b, the positions of the ejection holes 21c and 22c are not limited thereto and may be formed in various positions.

The substrate 30 may include the hole 31 into which the capacitor 10 is inserted. For example, the hole 31 may include a first portion 31a into which the cases 11a and 12a and the first regions 21a and 22a of the caps 21 and 22 are inserted, and a second portion 31b into which the second regions 21b and 22b of the caps 21 and 22 are inserted. The second portions 31b may include the cap contact surface 31b' in contact with the substrate contact surfaces 21b' and 22b' of the caps 21 and 22.

The hole 31 may include a first length L1, which is a length corresponding to the longitudinal direction of the cases 11a and 12a, and a second length L2, which is a length corresponding to the sum of the lengths of the diameters 2D1 of the plurality of cases 11a and 12a. In the drawings, the first length L1 is illustrated as being longer than the second length L2, but is not limited thereto. For example, when a plurality of capacitors are mounted on the substrate 30, the second length L2 may be longer than the first length L1.

In addition, the widthwise length L3 of the second portion 31b may be shorter than the length of the second regions 21b and 22b. Accordingly, the caps 21 and 22 may not fall downward from the substrate 30.

The substrate 30 may include a cap supporting portion 30a. The cap supporting portion 30a may be disposed between the second regions 21b and 22b of the caps. The widthwise length L3 of the cap supporting portion 30a may be provided to be greater than a length D1-D2 obtained by subtracting the diameter length D2 of the second regions 21b and 22b from the diameter length D1 of the first regions 21a and 22a. Accordingly, the cap supporting portion 30a may be disposed between the second regions 21b and 22b, and due to the above-described length relationship, the cap may be prevented/restricted from falling downward from the substrate 30.

The substrate 30 may include a wire hole 32 into which the wire 13 is inserted, and a coupling portion 34 provided to allow the fixing member 40 to be coupled to the substrate 30. A coupling hole 34a may be formed inside the coupling portion 34. The coupling portions 34 may be provided on the left and right sides of the capacitor 10, respectively. For example, the coupling portion 34 may be provided in plural. However, it is not limited thereto, and the position and shape of the coupling portion 34 is not limited to that shown in the drawings. For example, the coupling portion 34 may be formed only on the left or right side of the capacitor 10 as long as it can couple the fixing member 40 and the substrate 30 to each other. The coupling hole 34a may be formed in a circular shape.

The fixing member 40 may include a body 41, insertion protrusions 42, accommodating portions 44, and inserting portions 45.

The body 41 may extend in a third direction Z to form the body 41 of the fixing member 40. The body 41 may include a protruding portion 41a, a contact surface 41b, and opposite side end portions 41c. The protruding portion 41a may be disposed between the second regions 21b and 22b of the plurality of capacitors 10 and protrude in the second direction Y. The contact surface 41b may be in contact with the cap supporting portion 30a of the substrate 30. The opposite side end portions 41c may include a left side end portion and a right side end portion.

The insertion protrusions 42 may extend in the second direction Y from opposite ends of the body 41 in the third direction Z. That is, the insertion protrusions 42 may protrude toward the substrate 30 from the opposite side end portions 41c. The insertion protrusions 42 may be inserted into the coupling portions 34. The insertion protrusion 42 may be formed in a substantially trapezoidal shape. However, the shape of the insertion protrusion 42 is not limited thereto and may be formed in various shapes. The insertion protrusion 42 may be formed in a shape corresponding to the coupling portion 34 and the coupling hole 34a. Due to the insertion protrusion 42 and the coupling portion 34, the fixing member 40 may be stably coupled to the substrate 30 without being shaken or separated.

The inserting portion 45 may be in contact with one surface of the substrate 30 when the insertion protrusion 42 is coupled to the substrate 30. The inserting portion 45 may be provided between the insertion protrusion 42 and each side end portion 41c.

The accommodating portion 44 may be formed to correspond to the shape of the caps 21 and 22 so as to press the caps 21 and 22. For example, the accommodating portion 44 may be formed to have a diameter corresponding to the diameter D2 of the second regions 21b and 22b. The accommodating portion 44 may be provided in plural. For example, the plurality of accommodating portions 44a and 44b may include a first accommodating portion 44a corresponding to the first cap 21 and a second accommodating portion 44b corresponding to the second cap 22. In other words, the plurality of accommodating portions 44a and 44b include the first accommodating portion 44a pressing the second region 21b of the first cap 21 and the second accommodating portion 44b pressing the second region 22b of the second cap 22.

However, the accommodating portions 44 may not only be provided to fix the capacitors 10 by pressing the second regions 21b and 22b, but also be provided to fix the capacitors 10 by pressing the first regions 21a and 22a and the cases 11a and 12a. In this case, the position at which the fixing member 40 is coupled to the substrate 30 may be changed. For example, the coupling portion 34 may be moved along the first direction X, and the fixing member 40 may be moved to a position corresponding to the coupling portion 34 such that the insertion protrusion 42 of the fixing member 40 is inserted into the coupling hole 34a.

In addition, the number of accommodating portions 44 is not limited to two and may be provided in various numbers corresponding to the number of capacitors 10 and caps 21 and 22.

In order to prevent/restrict the capacitor 10 from falling down from the substrate 30, the widthwise length L3 of the second portion 31*b* of the substrate 30 may be provided to be shorter than the diameter D2 of the second regions 21*b* and 22*b*. Accordingly, each of the capacitors 10 may not fall to the lower side of the substrate 30. In addition, the second length L2 of the hole 31 may be formed shorter than a length 2*D1 obtained by summing the diameters of the first regions 21*a* and 22*a* of the plurality of caps 21 and 22. Since the diameter D1 of the first regions 21*a* and 22*a* is substantially similar to or the same as the diameter of the cases 11*a* and 12*a*, the capacitors 10 may be prevented/restricted from falling through the first portion 31*a* of the hole 31.

Figure 5:
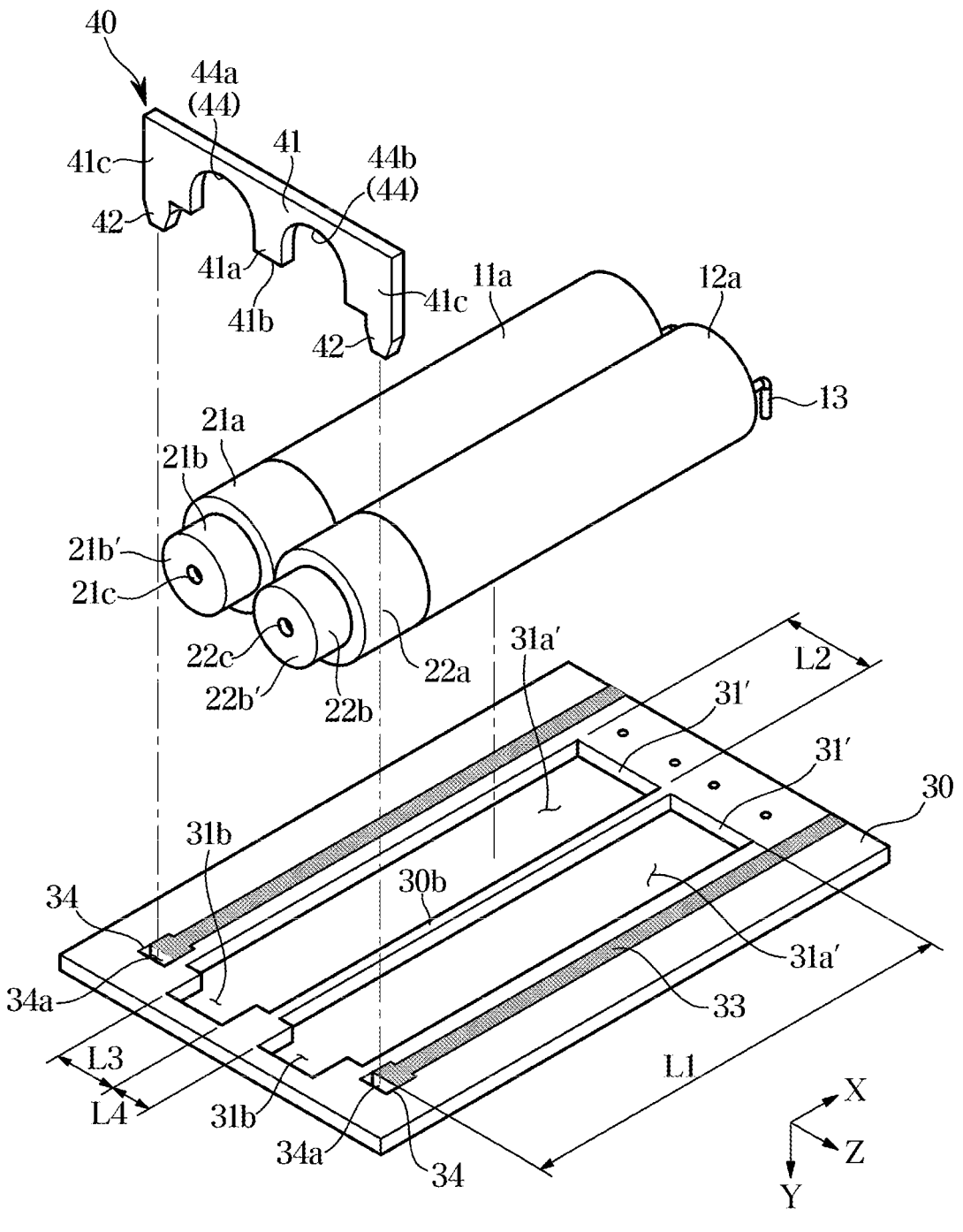
FIG. 5 is an exploded perspective view illustrating a capacitor and an electronic device including the same according to various embodiments.

FIG. 5 is an exploded perspective view illustrating a capacitor and an electronic device including the same according to various embodiments.

Referring to FIG. 5, the substrate 30 may further include a support rib 30*b* supporting the plurality of capacitors 10. The support rib 30*b* may extend along the first direction X between the cases 11*a* and 12*a*. For example, the support rib 30*b* may extend in the first direction X between the first case 11*a* and the second case 12*a*. The support rib 30*b* may traverse the hole 31. Accordingly, the area of the first portion 31*a* of the hole 31 may be reduced compared to the embodiment described above.

Due to the support rib 30*b*, each of the lower portions of the cases 11*a* and 12*a* and the caps 21 and 22 may be supported, so that the capacitors 10 may be prevented/restricted from falling to the lower side of the substrate 30.

Figure 6:
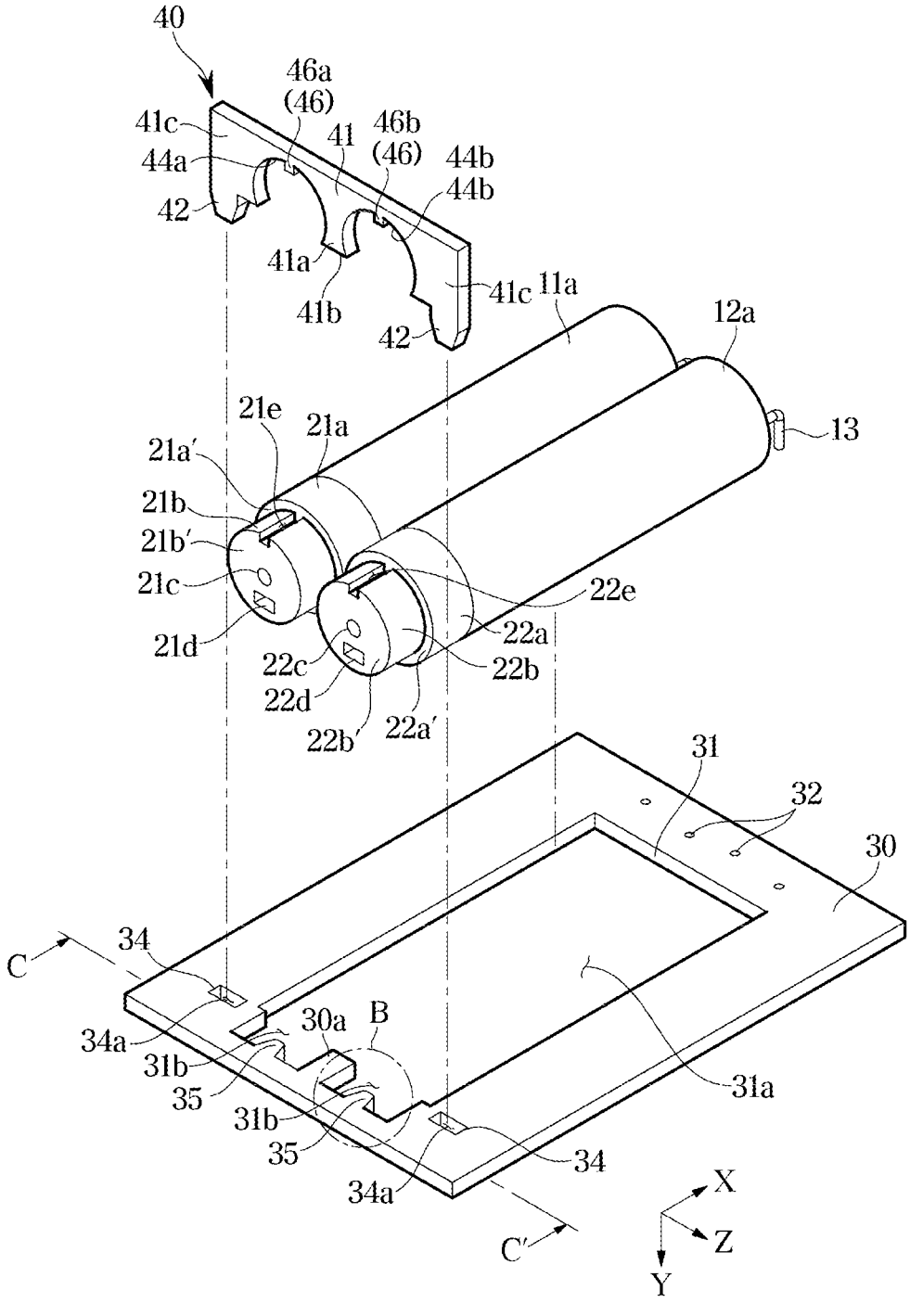
FIG. 6 is an exploded perspective view illustrating a capacitor and an electronic device including the same according to various embodiments.
Figure 7:
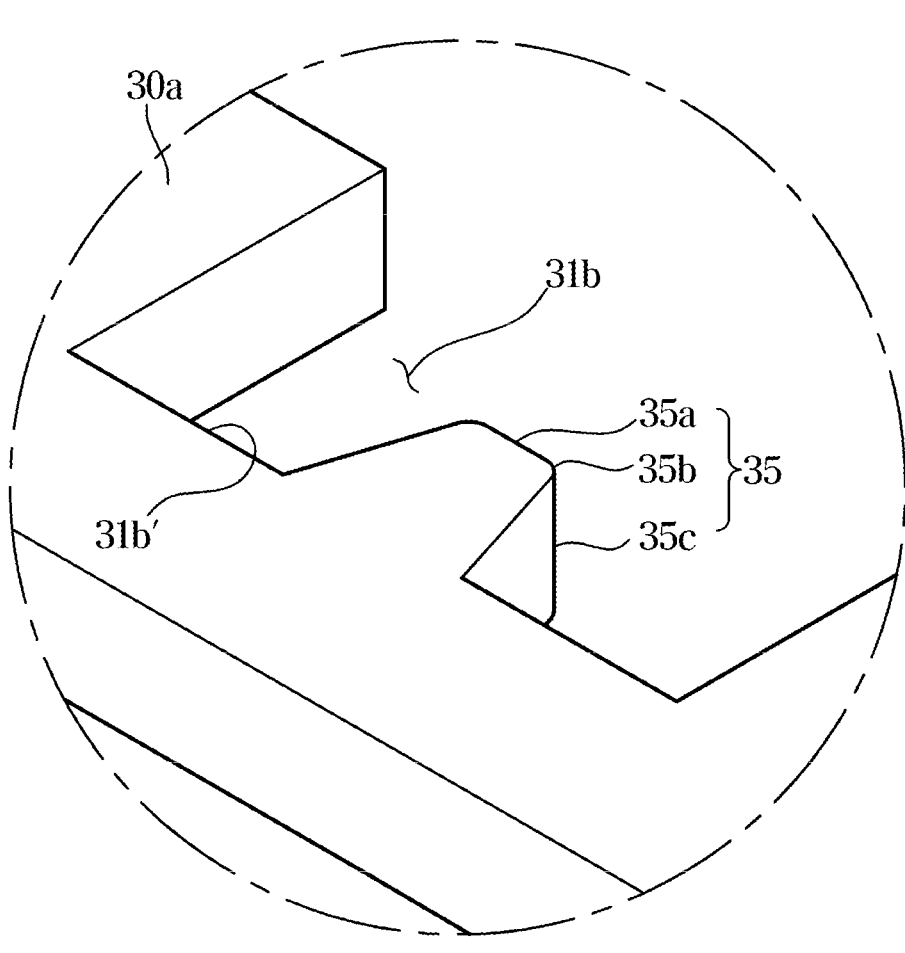
FIG. 7 is an enlarged perspective view of part B in a substrate shown in FIG. 6 according to various embodiments.
Figure 8:
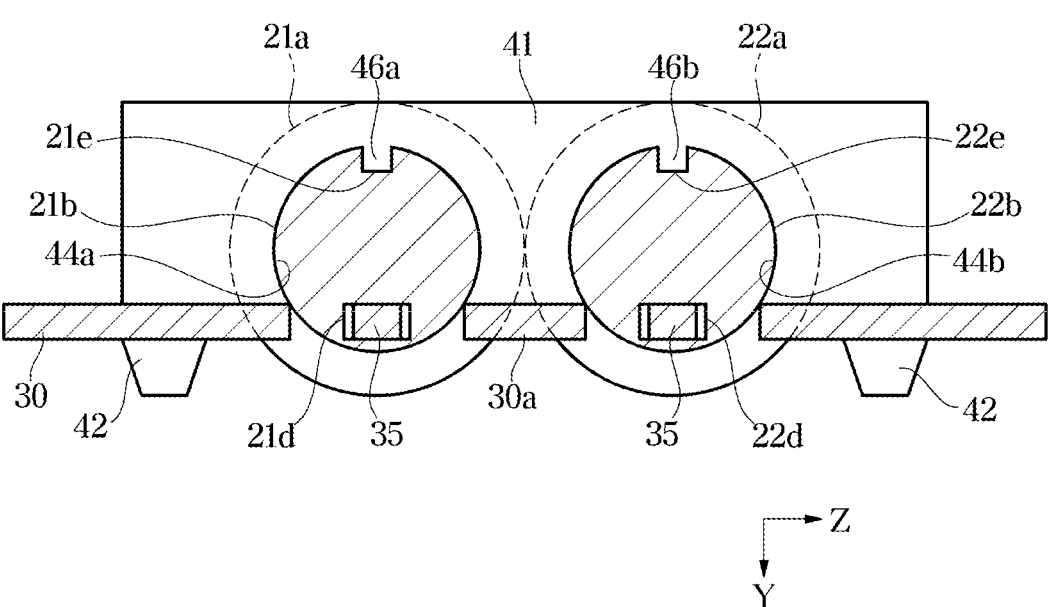
FIG. 8 is a cross-sectional view illustrating the electronic device shown in FIG. 6 with main components coupled thereto, taken along line C-C' according to various embodiments.

FIG. 6 is an exploded perspective view illustrating a capacitor and an electronic device including the same according to various embodiments. FIG. 7 is an enlarged view of part B in a substrate shown in FIG. 6 according to various embodiments. FIG. 8 is a cross-sectional view illustrating the electronic device shown in FIG. 6 with main components coupled thereto, taken along line C-C' according to various embodiments.

The same reference numerals are assigned to the same configurations as those in the above-described embodiment, and detailed description thereof may not be repeated.

Referring to FIGS. 6, 7 and 8, the fixing member 40 may include anti-rotation protrusions 46. The anti-rotation protrusion 46 may protrude from the body 41 in a direction pressing the caps 21 and 22. The anti-rotation protrusions 46 may protrude in the second direction Y. The anti-rotation protrusions 46 may be coupled to anti-rotation grooves 21*e* and 22*e* of the caps 21 and 22 such that the capacitors 10 may be stably mounted without rotation when the capacitors 10 are mounted on the substrate 30. The anti-rotation protrusions 46 may be provided corresponding in number to the number of mounted capacitors 10.

The anti-rotation protrusions 46*a* and 46*b* may be provided in plural. The plurality of anti-rotation protrusions 46*a* and 46*b* may include a first anti-rotation protrusion 46*a* and a second anti-rotation protrusion 46*b*. That is, the first anti-rotation protrusion 46*a* may protrude from the body 41 toward the first cap 21, and the second anti-rotation protrusion 46*b* may protrude from the body 41 toward the second cap 22.

However, the number and formation position of the anti-rotation protrusions 46*a* and 46*b* are not limited thereto. For example, when there are three or more capacitors 10, three or more anti-rotation protrusions 46*a* and 46*b* may be formed corresponding thereto. In addition, the anti-rotation protrusions may protrude from the protruding portion 41*a* toward the caps 21 and 22 in the third direction Z as long as it can prevent/restrict the capacitors 10 from being rotated.

The caps 21 and 22 may include anti-rotation grooves 21*e* and 22*e*. The anti-rotation grooves 21*e* and 22*e* may be formed to correspond to the anti-rotation protrusions 46*a* and 46*b*. For example, the anti-rotation grooves 21*e* and 22*e* may be provided by being recessed inward from the upper sides of the second regions 21*b* and 22*b*. The anti-rotation grooves 21*e* and 22*e* may be formed on upper surfaces of the second regions 21*b* and 22*b*. In the drawing, the anti-rotation grooves 21*e* and 22*e* extend from front surfaces 21*a*' and 22*a*' of the first regions to front surfaces 21*b*' and 22*b*' of the second regions along the first direction X, but are limited thereto. However, they may be formed at a shorter length in the second regions 21*b* and 22*b*. In addition, the anti-rotation grooves 21*e* and 22*e* may be formed on left or right side surface of the second regions 21*b* and 22*b* as long as the rotation of the capacitors 10 can be prevented and/or reduced. For example, the anti-rotation grooves 21*e* and 22*e* may be formed anywhere on the caps 21 and 22 along the circumferences of the caps 21 and 22. In addition, the cases 11*a* and 12*a* may have anti-rotation grooves 21*e* and 22*e*, and anti-rotation protrusions 46*a* and 46*b* of the fixing member 40 are coupled thereto.

The anti-rotation grooves 21*e* and 22*e* may be provided in plural. The plurality of anti-rotation grooves 21*e* and 22*e* may include a first anti-rotation groove corresponding to the first anti-rotation protrusion 46*a* and a second anti-rotation groove corresponding to the second anti-rotation protrusion 46*b*. However, the number of anti-rotation grooves 21*e* and 22*e* is not limited thereto, and may be three or more or one formed corresponding to the number of anti-rotation protrusions 46*a* and 46*b*.

Since the caps 21 and 22 include the anti-rotation grooves 21*e* and 22*e*, respectively, and the fixing member 40 includes the anti-rotation protrusions 46*a* and 46*b* corresponding thereto, the caps 21 and 22 and the capacitors 10 may be stably mounted on the substrate 30 without being rotated.

The caps 21 and 22 may include substrate coupling grooves 21*d* and 22*d*. The substrate coupling grooves 21*d* and 22*d* may be formed to correspond to coupling protrusions 35. That is, the substrate coupling grooves 21*d* and 22*d* may be provided as recesses in the front surfaces 21*b*' and 22*b*' of the second regions 21*b* and 22*b*. The location of the substrate coupling grooves 21*d* and 22*d* is illustrated as the center of the lower portion of the front surface 21*b*' or 22*b*', but is not limited thereto, and may be formed on the left or right side of the lower portion of the front surface of the second region 21*b* or 22*b*. In this case, the coupling protrusions 35 of the substrate 30 may be formed at a position corresponding to the substrate coupling grooves 21*d* and 22*d*.

The number of the substrate coupling grooves 21*d* and 22*d* may be formed to correspond to the coupling protrusions 35. The substrate coupling grooves 21*d* and 22*d* may include a first substrate coupling groove 21*d* and a second substrate coupling groove 22*d*.

The substrate 30 may include coupling protrusions 35 coupled to the substrate coupling grooves 21*d* and 22*d*. The coupling protrusions 35 may protrude toward the hole 31. For example, the coupling protrusions 35 may protrude in the first direction X toward the second portions 31*b*. The coupling protrusions 35 may be inserted into the substrate coupling grooves 21*d* and 22*d* to couple the capacitors 10 to the substrate 30 to prevent/restrict the capacitor 10 from shaking or falling downward.

Therefore, since the substrate coupling grooves 21*d* and 22*d* are stably coupled to the coupling protrusions 35, the capacitors 10 may be mounted on the substrate 30 by simply changing the shape of the substrate and the caps 21 and 22 without additional subsidiary materials. Accordingly, production costs may be reduced, and since the substrate coupling grooves are easily coupled to the coupling protrusions 35, production efficiency may be increased.

The coupling protrusion 35 may include an inserting portion 35*a*, a rounding portion 35*b*, and an inclined portion 35*c*.

The inserting portion 35*a* may protrude from the substrate 30 in the first direction X to the largest degree. The inserting portions 35*a* may be inserted into the substrate coupling groove 21*d* or 22*d*. The inserting portions 35*a* may be in contact with the inner surface of the substrate coupling groove 21*d* or 22*d*. The rounding portion 35*b* may be formed to be rounded to guide insertion of the coupling protrusion 35 when the coupling protrusion 35 is inserted into the substrate coupling groove 21*d* or 22*d*. The inclined portion 35*c* may be formed to be inclined as a portion provided between the cap contact surface 31*b*' and the rounding portion 35*b*. Due to the inclined portion 35*c*, the coupling protrusion 35 may be easily inserted into the substrate coupling groove 21*d* or 22*d*.

According to the embodiment of the present disclosure, the first accommodating portion 44*a* may be provided to surround the second region 21*b* of the first cap 21, and the second accommodating portion 44*b* may be provided to surround the second region 22*b* of the second cap 22. However, it is not limited to the above example.

Figure 9:
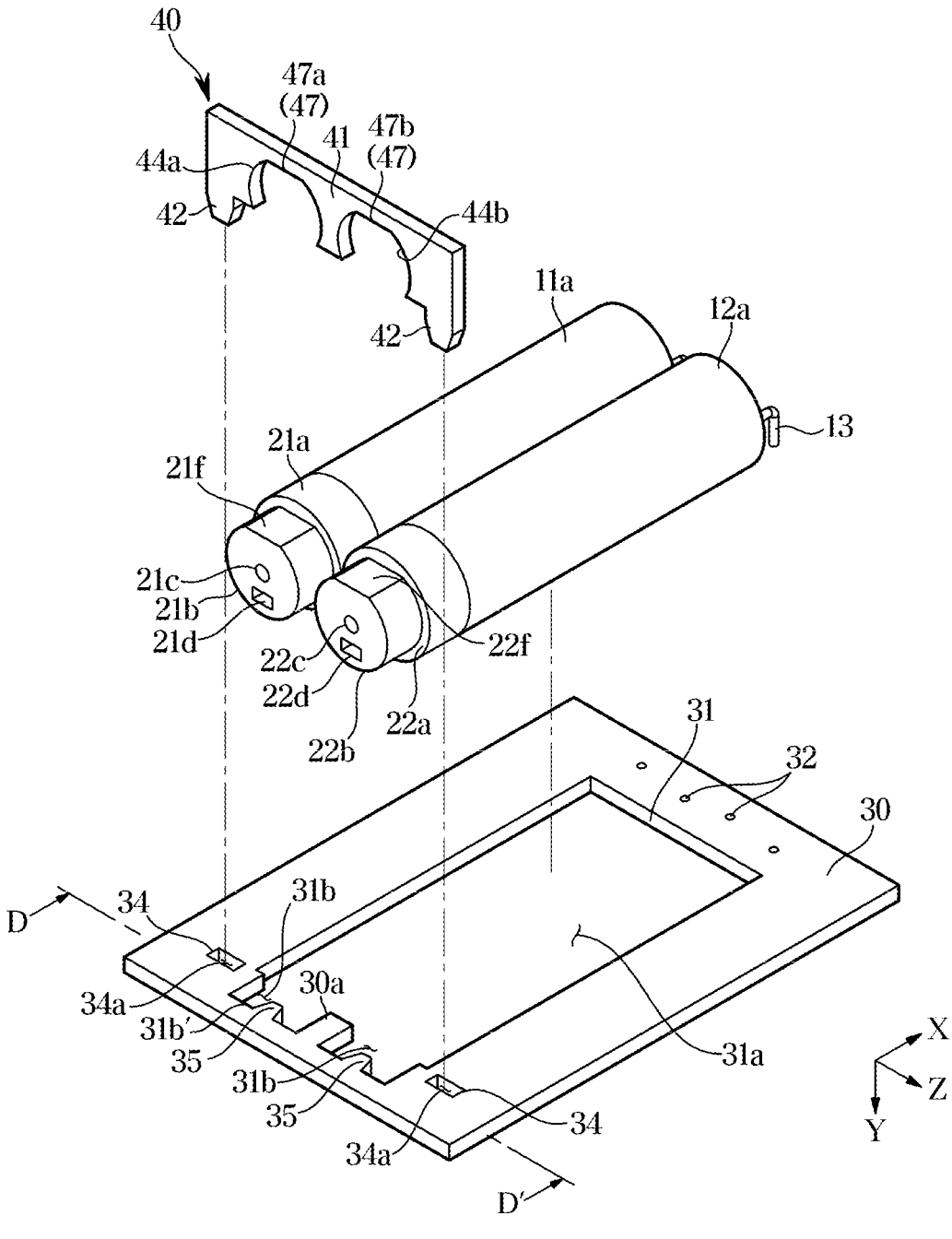
FIG. 9 is an exploded perspective view illustrating a capacitor and an electronic device including the same according to various embodiments.
Figure 10:
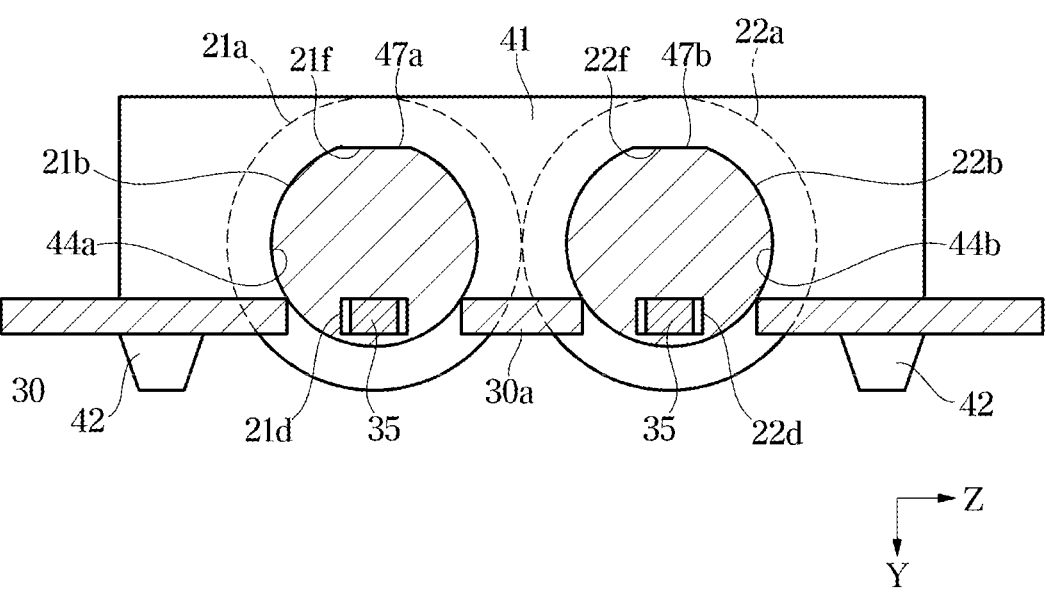
FIG. 10 is a cross-sectional view illustrating the electronic device shown in FIG. 9 with main components coupled thereto, taken along line D-D' according to various embodiments.

FIG. 9 is an exploded perspective view illustrating a capacitor and an electronic device including the same according to various embodiments. FIG. 10 is a cross-sectional view illustrating the electronic device show in FIG. 9 with main components coupled thereto, taken along line D-D' according to various embodiments.

The same reference numerals are assigned to the same configurations as those of the above-described embodiment, and detailed descriptions may not be repeated.

Referring to FIGS. 9 and 10, at least a part of the fixing member 40 may include a flat surface. For example, one surfaces of the accommodating portions 44*a* and 44*b* may be formed as flat surfaces. For example, a surface of the fixing member 40 facing the upper surfaces of the second regions 21*b* and 22*b* may include a flat surface.

The one surfaces of the accommodating portions 44*a* and 44*b* may serve as anti-rotation surfaces 47*a* and 47*b*. The anti-rotation surfaces 47*a* and 47*b* may be in contact with one surfaces of the caps 21 and 22 to prevent/restrict the capacitors 10 from rotating. Therefore, the anti-rotation surfaces 47*a* and 47*b* may be formed corresponding in number to the number of mounted capacitors 10.

The anti-rotation surfaces 47*a* and 47*b* may be provided in plural. The plurality of anti-rotation surfaces may include a first anti-rotation surface 47*a* and a second anti-rotation surface 47*b*. For example, the first anti-rotation surface 47*a* is in contact with one surface of the first cap 21, and the second anti-rotation surface 47*b* is in contact with one surface of the second cap 22 to prevent/restrict the caps 21 and 22 from rotating. In the drawings, the anti-rotation surfaces 47*a* and 47*b* are illustrated as being in contact with upper surfaces 21*f* and 22*f* of the caps 21 and 22, but are not limited thereto, and may make surface contact with the left or right side surfaces of the caps 21 and 22 to prevent/restrict the caps 21 and 22 from rotating. In this case, the left and right side surfaces of the caps 21 and 22 may be formed as flat surfaces, and surfaces of the caps 44*a* and 44*b* facing the left and right side surfaces may be formed as flat surfaces.

At least a part of the caps 21 and 22 may include flat surfaces 21*f* and 22*f*. For example, the upper surfaces 21*f* and 22*f* of the caps 21 and 22 may be formed as flat surfaces 21*f* and 22*f* to be in contact with the anti-rotation surfaces 47*a* and 47*b* of the fixing member 40. However, the flat surfaces of the caps 21 and 22 are not limited to the upper surfaces, and the flat surfaces of the caps 21 and 22 may also be formed on the left or right side surfaces to corresponding to the anti-rotation surfaces 47*a* and 47*b*. In addition, the caps 21 and 22 may include upper surfaces 21*f* and 22*f*, respectively. For example, the flat surfaces of the caps 21 and 22 may be formed corresponding in the number and position to the anti-rotation surfaces 47*a* and 47*b*.

Since each of the caps 21 and 22 includes a flat surface formed in at least a part thereof, and the fixing member 40 includes the anti-rotation surface 47*a* and 47*b* corresponding thereto, the caps 21 and 22 and the capacitor 10 may be stably mounted on the substrate 30 without being rotated.

In addition, when mounting the capacitors 10 on the substrate 30, the capacitor 10 may be assembled to the substrate 30 from above the capacitor 10. Therefore, since at least a part of the caps 21 and 22 includes a flat surface, the assembler may recognize whether the capacitor 10 is rotated in a direction other than the correct position and may recognize a correct coupling direction before assembling. In addition, the assembler may increase the assembly speed by allowing the substrate coupling grooves 21*d* and 22*d* to be arranged at a lower side. Accordingly, the production efficiency may be increased.

Figure 11:
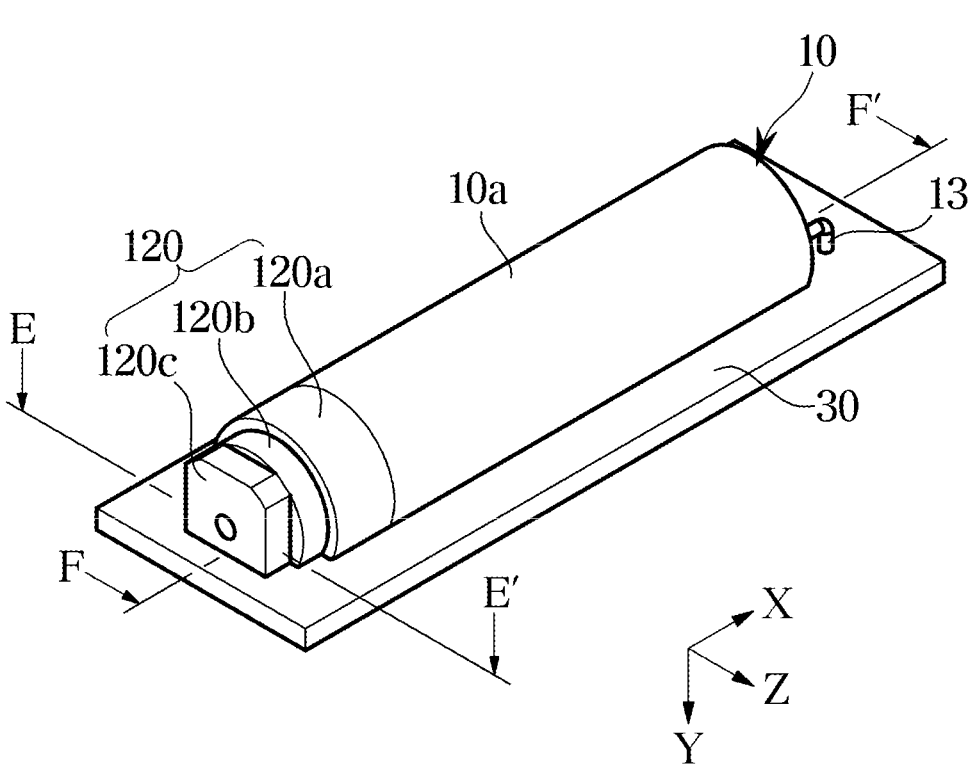
FIG. 11 is a perspective view illustrating a capacitor and an electronic device including the same according to various embodiments.
Figure 12:
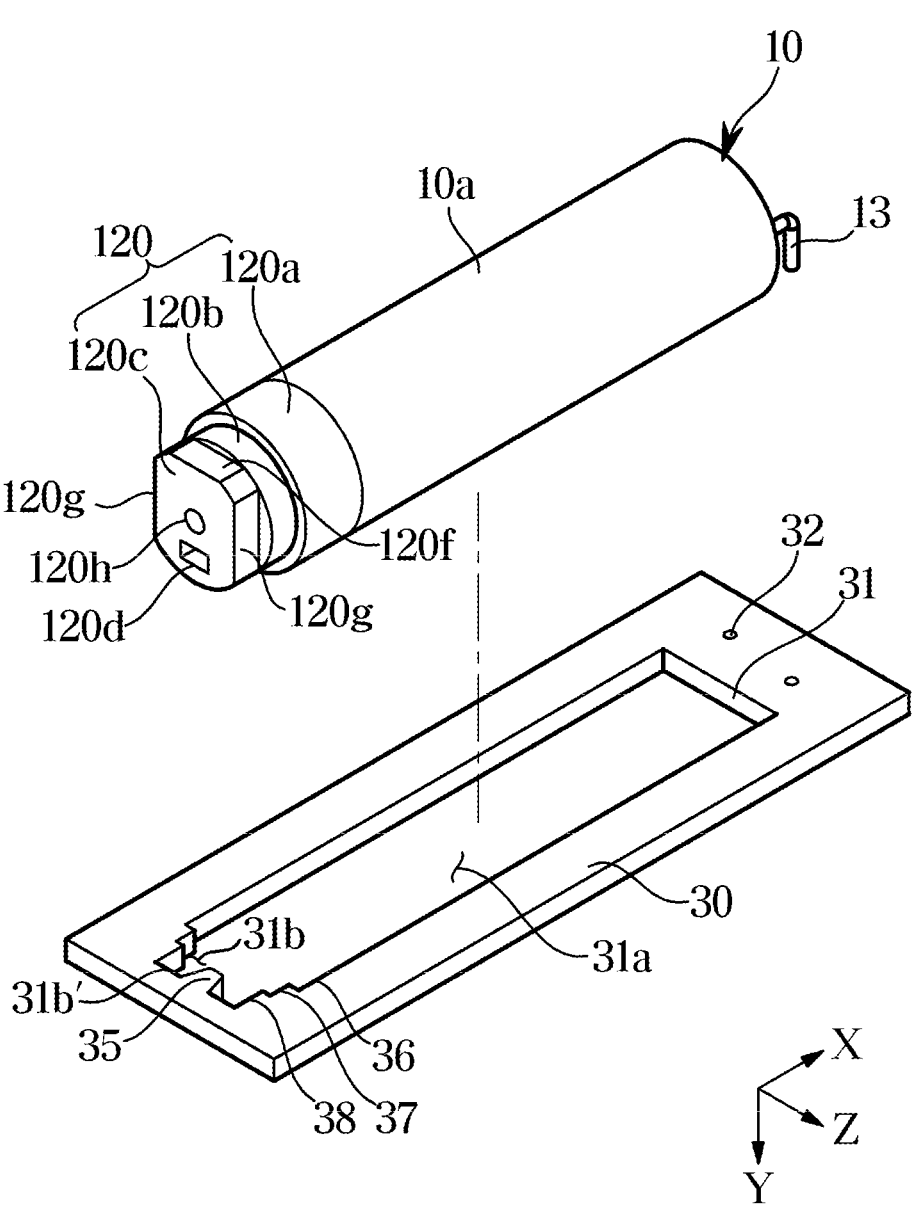
FIG. 12 is an exploded perspective view of the capacitor and the electronic device including the same shown in FIG. 11 according to various embodiments.
Figure 13:
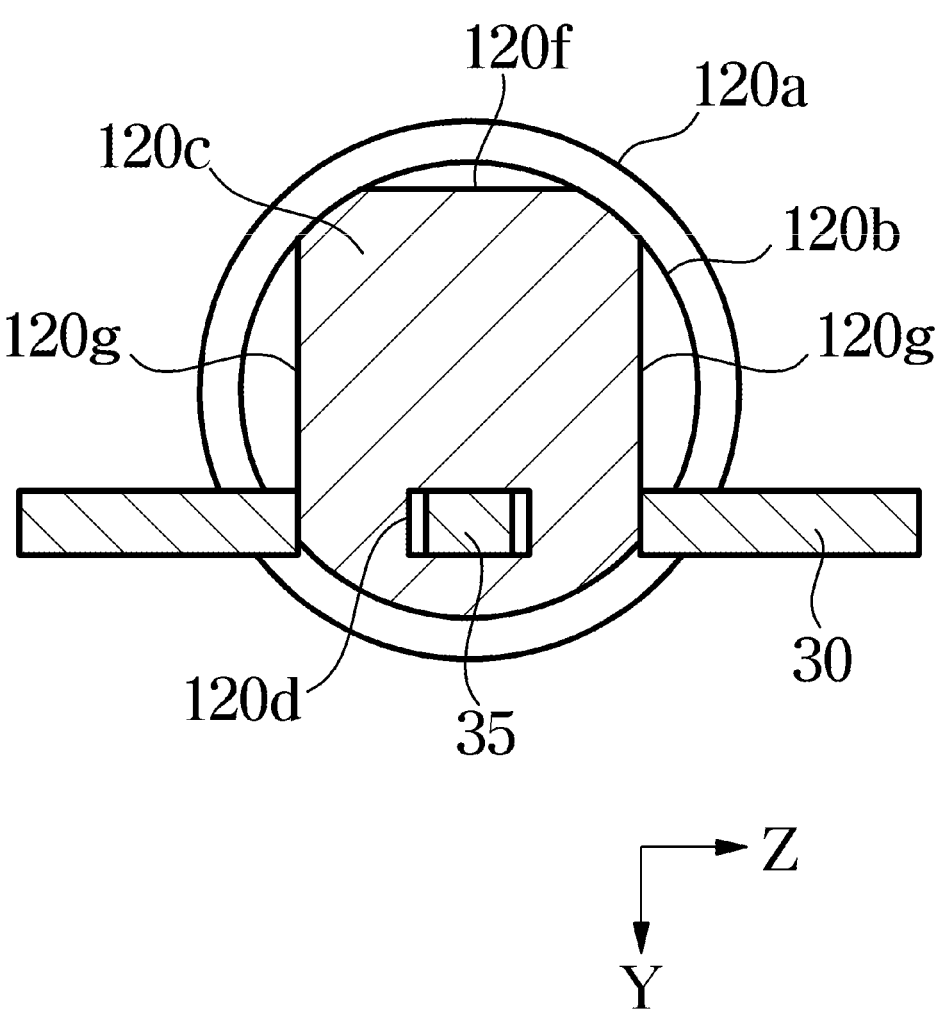
FIG. 13 is a cross-sectional view of the capacitor and the electronic device including the same shown in FIG. 11, taken along line E-E' according to various embodiments.
Figure 14:
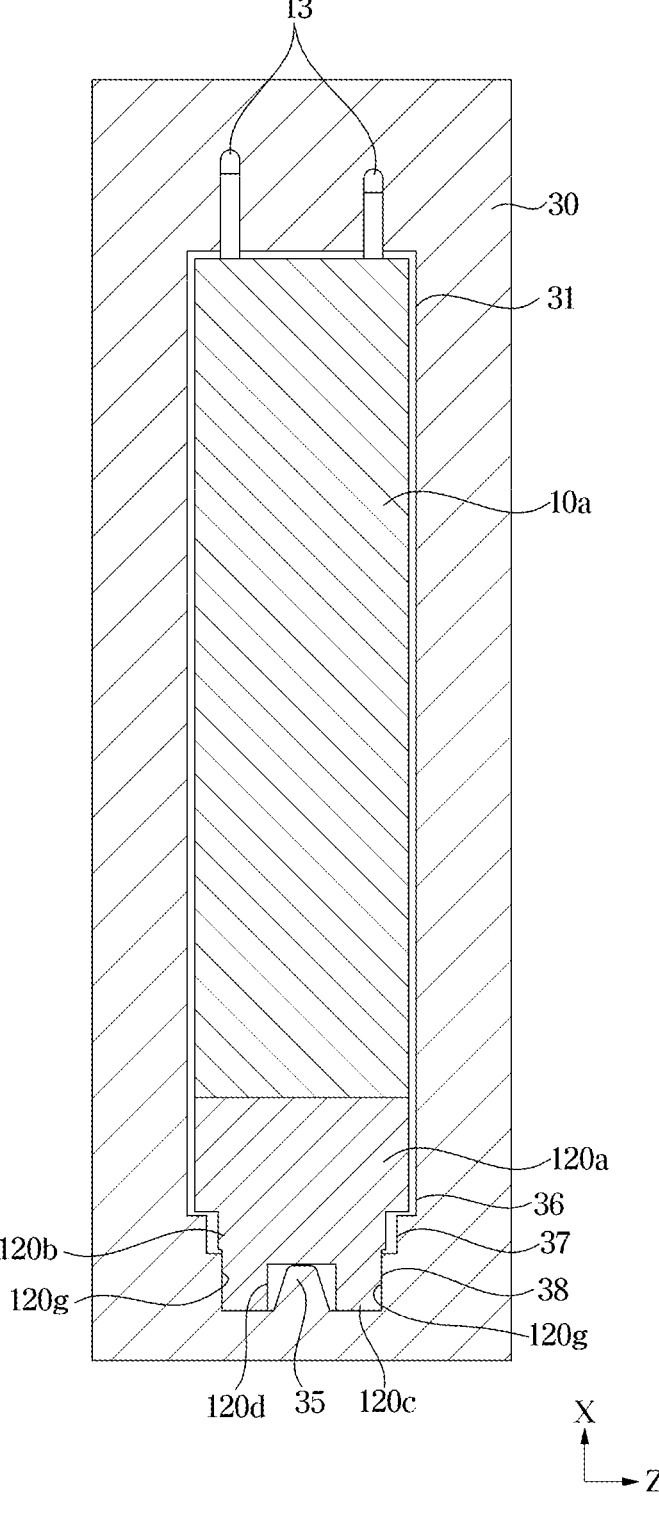
FIG. 14 is a cross-sectional view of the capacitor and the electronic device including the same shown in FIG. 11, taken along line F-F according to various embodiments.

FIG. 11 is a perspective view illustrating a capacitor and an electronic device including the same according to various embodiments. FIG. 12 is an exploded perspective view of the capacitor and the electronic device including the same shown in FIG. 11 according to various embodiments. FIG. 13 is a cross-sectional view of the capacitor and the electronic device including the same shown in FIG. 11, taken along line E-E according to various embodiments. FIG. 14 is a cross-sectional view of the capacitor and the electronic device including the same shown in FIG. 11, taken along line F-F according to various embodiments.

The same reference numerals are assigned to the same configurations as those of the above-described embodiment, and detailed descriptions may not be repeated.

Referring to FIGS. 11, 12, 13 and 14, a cap 120 may include a plurality of regions 120*a*, 120*b*, and 120*c*. The plurality of regions may include a first region 120*a*, a second region 120*b*, and a third region 120*c*. The first region 120*a* may be coupled to the case 10*a*. The second region 120*b* may from a level difference from the first region 120*a* to guide the assembly of the capacitor 10 when an assembler mounts the capacitor 10 on the substrate 30. The third region 120*c* may form a level difference from the second region 120*b* and may be in contact with the cap contact surface 31*b*'.

When mounting the capacitor 10 on the substrate 30, the capacitor 10 may be mounted in a direction opposite to the first direction X. Accordingly, the second region 120*b* may enable an assembler to easily insert the capacitor 10 into the hole 31.

The third region 120*c* may include flat surfaces formed at an upper surface 120*f* and left and right side surfaces 120*g*. Since the upper surface 120*f* is formed as a flat surface, the assembler may recognize whether the capacitor 10 is rotated in a direction other than the correct position and may recognize a correct coupling direction before assembling, as described above. In addition, the left and right side surfaces 120*g* are formed as flat surfaces and be in contact with a third coupling surface 38 of the substrate 30, and thus rotation and shaking of the capacitor 10 may be prevented/restricted.

The substrate 30 may include a plurality of coupling surfaces to correspond to the cap 120. The plurality of coupling surfaces 36, 37, and 38 include a first coupling surface 36 corresponding to the first region 120a of the cap 120, a second coupling surface 37 corresponding to the second region 120b, and a third coupling surface 38 corresponding to the third region 120c. The number of coupling surfaces 36, 37, and 38 is not limited thereto and may be provided in various numbers corresponding to the regions of the cap 120.

The plurality of coupling surfaces 36, 37, and 38 may be stepped from each other. That is, the first coupling surface 36 and the second coupling surface 37 may be stepped from each other, and the second coupling surface 37 and the third coupling surface 38 may be stepped from each other.

Since the plurality of coupling surfaces 36, 37, and 38 are formed to correspond to the plurality of regions 120a, 120b, and 120c, assembly of the capacitor 10 to the substrate 30 may be more easily performed. For example, when the assembler assembles the capacitor 10 to the substrate 30 in a direction opposite to the first direction X with the second region 120b and the second coupling surface 37, the second coupling surface 37 and the second region 120b may guide the third region 120c to be seated in the second portion 31b of the hole 31.

The cap 120 may include the substrate coupling groove 120d and the ejection hole 120h as in the above-described embodiment. The substrate coupling groove 120d may be coupled to the coupling protrusion 35 to allow the capacitor 10 to be fixed to the substrate 30. The ejection hole 120h may be provided in the third region 120c to eject the electrolyte gas leaked from the explosion-proof surface of the capacitor 10.

Figure 15:
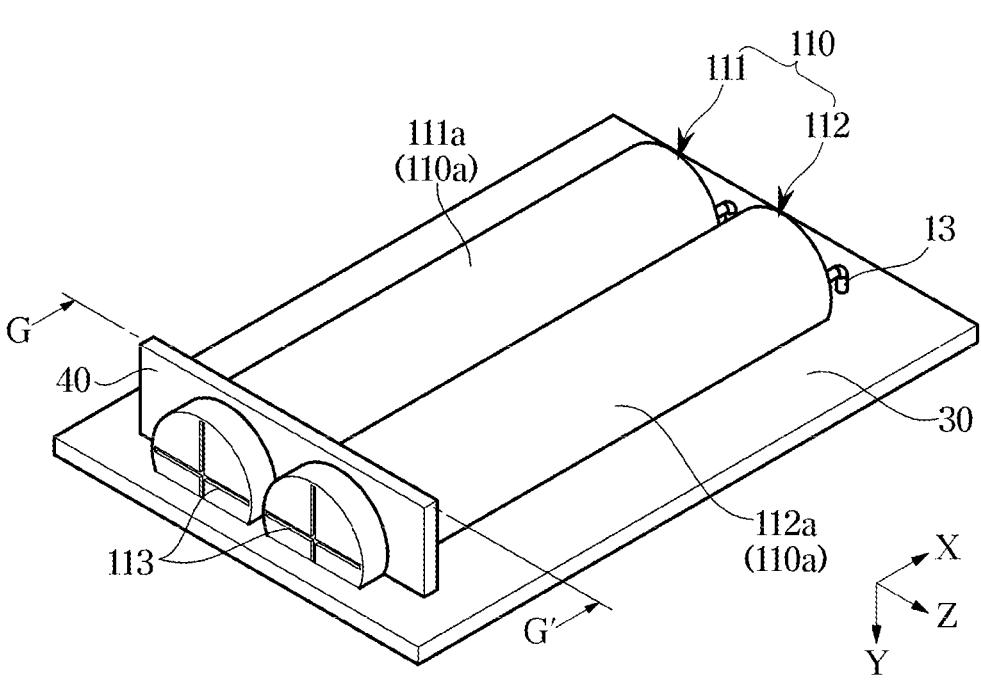
FIG. 15 is a perspective view illustrating a capacitor and an electronic device including the same according to various embodiments.
Figure 16:
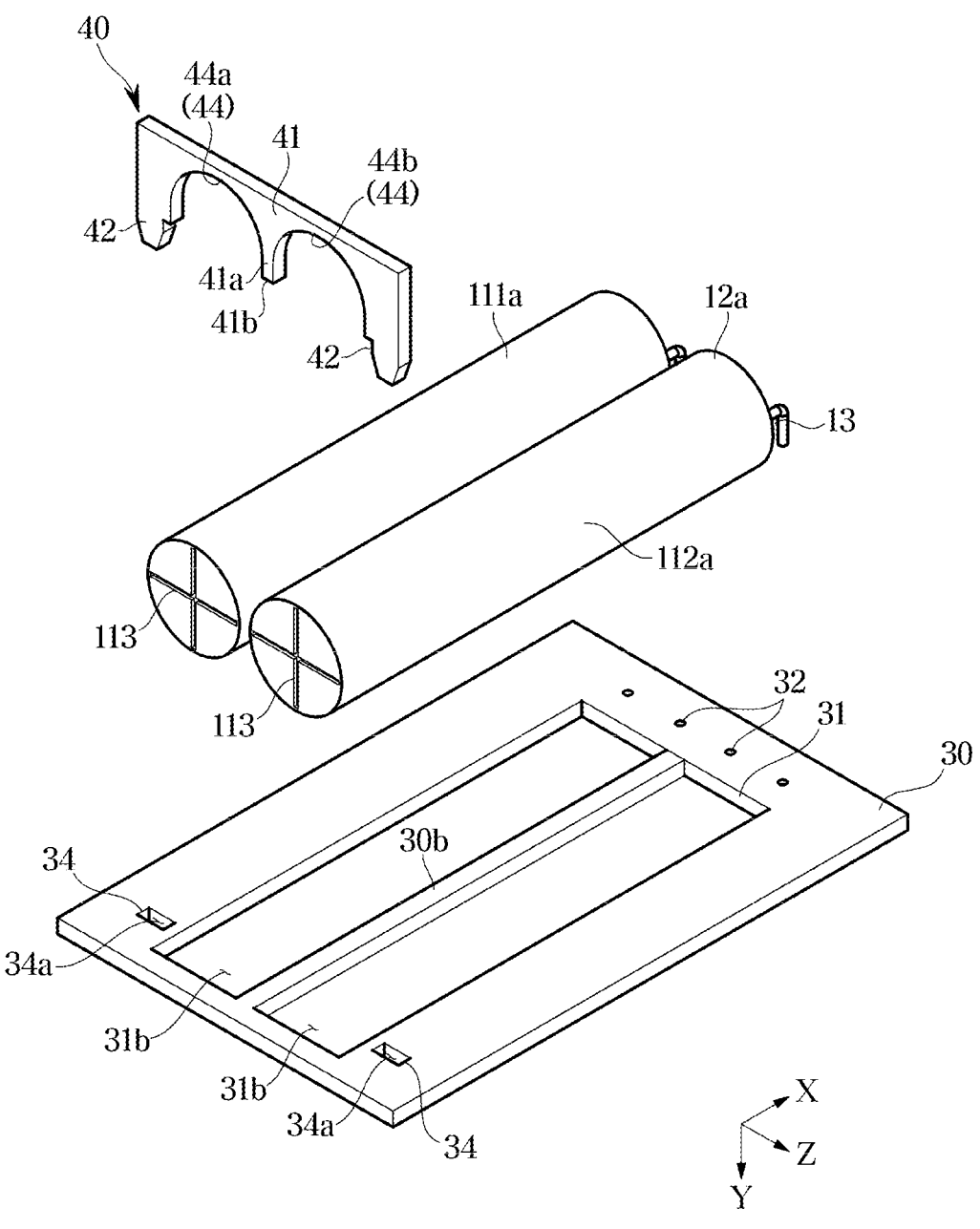
FIG. 16 is an exploded perspective view of the capacitor and the electronic device including the same shown in FIG. 15 according to various embodiments.
Figure 17:
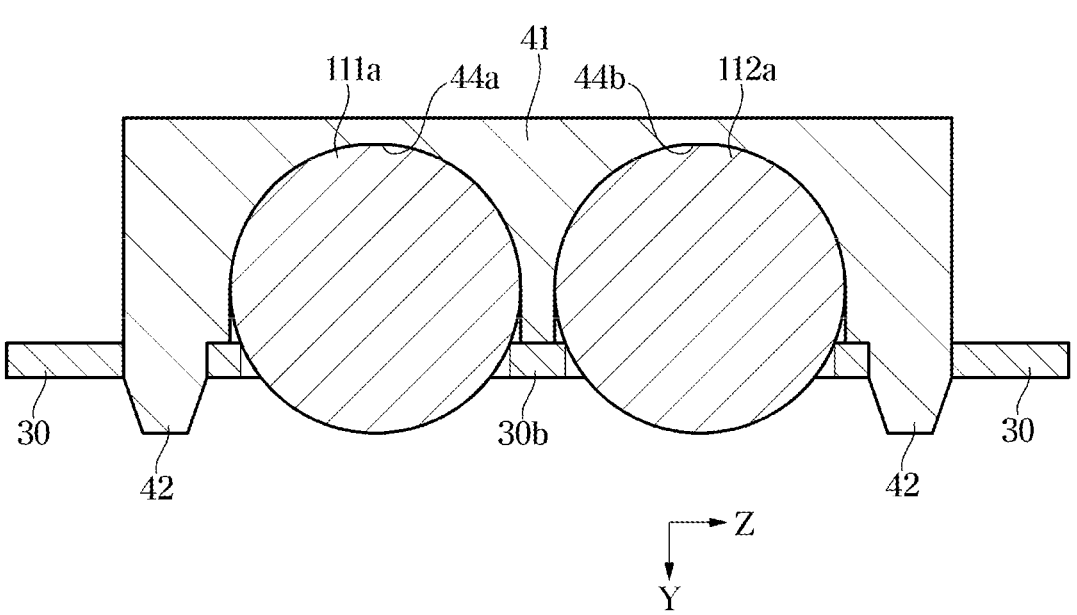
FIG. 17 is a cross-sectional view of the capacitor and the electronic device including the same shown in FIG. 15, taken along line G-G' according to various embodiments.

FIG. 15 is a perspective view illustrating a capacitor and an electronic device including the same according to various embodiments. FIG. 16 is an exploded perspective view of the capacitor and the electronic device including the same shown in FIG. 15 according to various embodiments. FIG. 17 is a cross-sectional view of the capacitor and the electronic device including the same shown in FIG. 15, taken along line G-G' according to various embodiments.

The same reference numerals are assigned to the same configurations as those of the above-described embodiment, and detailed descriptions thereof may not be repeated.

Referring to FIGS. 15, 16 and 17, the electronic device may include a fixing member 40 provided to press cases 111a and 111b in the second direction Y. Fore example, the fixing member 40 may press the circumferences of the cases 111a and 111b such that the capacitors 110 are fixed to the substrate 30. The cases 111a or 111b may include explosion guides 113 formed at one ends thereof in a direction opposite to the first direction X. The explosion guide 113 may be provided as a recess in the explosion-proof surface.

The substrate 30 may include a coupling portion 34 provided to allow the fixing member 40 to be coupled to the substrate 30. A coupling hole 34a may be formed inside the coupling portion 34. The coupling portions 34 may be provided on the left and right sides of the capacitor 110, respectively. That is, the coupling portion 34 may be provided in plural. However, it is not limited thereto, and the position and shape of the coupling portion 34 is not limited to that shown in the drawings. For example, the coupling portion 34 may be formed only on the left or the right side of the capacitor 110 as long as it can couple the fixing member 40 and the substrate 30 to each other. The coupling hole 34a may be formed in a circular shape, but is not limited thereto.

The fixing member 40 may include insertion protrusions 42 extending in the second direction Y from opposite ends of the body 41 in the third direction Z. For example, the insertion protrusion 42 may protrude toward the substrate 30 from the opposite side end portions 41c. The insertion protrusions 42 may be inserted into the coupling portions 34. The insertion protrusion 42 may be formed in a shape corresponding to the coupling portion 34 and the coupling hole 34a. Due to the insertion protrusion 42 and the coupling portion 34, the fixing member 40 may be stably coupled to the substrate 30 without being shaken or separated.

According to an embodiment of the present disclosure, the cap may be omitted. For example, the fixing member 40 may press the cases 111a and 111b in the second direction Y. Since the fixing member 40 is inserted into the substrate 30 and presses the cases 111a and 111b as described above, the capacitors 110 may be stably mounted on the substrate 30.

Therefore, the capacitors 110 may be mounted on the substrate 30 while minimizing and/or reducing additional subsidiary materials. Through this, production costs may be reduced, and such a simple coupling structure may improve productivity. In addition, since the fixing member 40 may be formed by recycling the substrate 30 that is removed when forming the hole 31 of the substrate 30, additional production costs may be reduced.

In the drawing, the coupling protrusion 35 of the substrate 30 and the anti-rotation protrusion 46 of the fixing member 40 are not shown, but the disclosure is not limited to those shown in the drawing, and the coupling protrusion 35 and the anti-rotation protrusion 46 may be formed. In addition, correspondingly, substrate coupling grooves 21d and 22d and anti-rotation grooves 21e and 22e may be formed in the cases 111a and 111b.

While the disclosure has been illustrated and described with reference to various example embodiments, it will be understood that the various example embodiments are intended to be illustrative, not limiting. It will be further understood by those skilled in the art that various changes and modifications may be made in these example embodiments without departing from the principles and scope according to the disclosure, including the appended claims and their equivalents. It will also be understood that any of the embodiment(s) described herein may be used in conjunction with any other embodiment(s) described herein.

What is claimed is:

1. An electronic device comprising:
a substrate including a hole;
a plurality of capacitors each including a body extending to be inserted into the hole and an electrode wire provided at one end of the body and electrically connected to the substrate; and
a fixing member comprising a plurality of accommodating portions configured to press an opposite end of the capacitor bodies toward the substrate to fix the plurality of capacitors to the substrate, the plurality of accommodating portions encompassing upper outer circumferences of the capacitor bodies or capacitor components associated with the capacitor bodies.

2. The electronic device of claim 1, wherein the fixing member includes an insertion protrusion protruding in a direction perpendicular to the substrate and configured to be coupled to the substrate, and
the substrate includes a coupling portion corresponding to the insertion protrusion.

3. The electronic device of claim 1, wherein the electronic device includes a cap coupled to each opposite end of the bodies to restrict an electrolyte provided inside the bodies from being scattered, each cap includes a substrate coupling groove including a recession at one end, and the substrate includes a plurality of coupling protrusions protruding toward the hole configured to be respectively coupled to the substrate coupling grooves.

4. The electronic device of claim 3, wherein the bodies and the caps have a cylindrical shape, the hole includes a first portion into which each of the bodies is configured to be inserted and a second portion into which each of the caps is configured to be inserted, each cap includes a first region having a same diameter as a diameter of the body and a second region having a diameter smaller than the diameter of the first region to have a level difference from the first region, and a width of the second portion is shorter than a diameter of each of the second regions.

5. The electronic device of claim 4, wherein the substrate includes a cap supporting portion disposed between the first regions, and a length of the cap supporting portion is longer than a length obtained by subtracting a diameter length of the second region from a diameter length of the first region.

6. The electronic device of claim 3, wherein each of the plurality of coupling protrusions includes a rounding portion configured to guide coupling with a respective one of the substrate coupling grooves.

7. The electronic device of claim 1, wherein the electronic device includes caps respectively coupled to each opposite end of the bodies, wherein the fixing member includes a plurality of anti-rotation protrusions protruding toward the caps configured to restrict the bodies from rotating, and each cap includes an anti-rotation groove corresponding to a respective one of the plurality of anti-rotation protrusions and configured to accommodate the respective one of the plurality of anti-rotation protrusions.

8. The electronic device of claim 1, wherein the electronic device includes caps respectively coupled to each opposite end of the bodies, wherein at least a part of the fixing member in contact with the caps includes a flat surface configured to restrict the body from rotating, and at least a part of each of the caps in contact with the fixing member includes a flat surface.

9. The electronic device of claim 3, wherein the caps each include a plurality of regions stepped from each other in a direction in which the bodies extend, the plurality of regions include:

a first region coupled to the body, a second region forming a level difference from the first region configured to guide mounting of the body, and a third region forming a level difference from the second region and in which the substrate coupling groove is formed, and the third region includes:

an upper surface including a flat surface, and left and right side surfaces including flat surfaces configured to restrict the cap from shaking in a left-right direction.

10. The electronic device of claim 1, wherein the substrate includes a support rib provided between the plurality of capacitors in a direction in which the bodies extend, configured to support the plurality of capacitors in a up-down direction.

11. The electronic device of claim 1, wherein the fixing member includes an auxiliary substrate on which a circuit pattern is formed, and the auxiliary substrate is electrically connected to a circuit pattern formed on the substrate.

12. An electronic device comprising:

a substrate including a hole and a coupling protrusion protruding toward the hole; and a capacitor including a body extending and configured to be inserted into the hole and a cap coupled to one end of the capacitor along a direction in which the body extends, wherein the cap includes a substrate coupling groove recessed at one end of the cap corresponding to the coupling protrusion configured for the substrate coupling groove to be coupled to the coupling protrusion.

13. The electronic device of claim 12, wherein the cap includes a plurality of regions stepped from each other in a direction in which the body extends, the plurality of regions include a first region coupled to the body, a second region forming a level difference from the first region configured to guide mounting of the body, and a third region forming a level difference from the second region and in which the substrate coupling groove is formed, and the third region includes an upper surface including a flat surface, and left and right side surfaces including flat surfaces configured to restrict the cap from shaking in a left-right direction.

14. The electronic device of claim 12, comprising a fixing member configured to press the body to fix the body to the substrate.

15. The electronic device of claim 14, wherein the fixing member includes an insertion protrusion protruding toward the substrate configured to be coupled to the substrate, and the substrate includes a coupling portion corresponding to the insertion protrusion.

* * * * *